United States Patent
Löbl et al.

(10) Patent No.: US 6,466,105 B1
(45) Date of Patent: Oct. 15, 2002

(54) BULK ACOUSTIC WAVE FILTER

(75) Inventors: Hans-Peter Löbl, Monschau (DE); Mareike Klee, Hückelhoven (DE); Lukas Leyten, Eindhoven (NL)

(73) Assignees: Koninklijke Philips Electronics N.V., Eindhoven (NL); U.S. Philips Corporation, New York, NY (US)

( * ) Notice: Subject to any disclaimer, the term of this patent is extended or adjusted under 35 U.S.C. 154(b) by 0 days.

(21) Appl. No.: 09/610,595

(22) Filed: Jul. 5, 2000

(30) Foreign Application Priority Data

Jul. 7, 1999 (DE) .......................................... 199 31 297

(51) Int. Cl.[7] .................................................. H03H 9/17
(52) U.S. Cl. ........................ 333/187; 333/191; 310/322
(58) Field of Search ................................ 333/187, 186, 333/189, 191; 310/364, 335, 348, 322

(56) References Cited

U.S. PATENT DOCUMENTS

| 5,311,095 A | 5/1994 | Smith et al. | 310/334 |
| 5,872,493 A | * 2/1999 | Ella | 333/191 |
| 5,873,154 A | 2/1999 | Ylilammi et al. | 29/25.35 |
| 6,125,027 A | * 9/2000 | Klee et al. | 361/320 |

FOREIGN PATENT DOCUMENTS

| EP | 0609555 A2 | 8/1994 | H03H/9/17 |
| EP | 0689249 A2 | 12/1995 | H01L/29/43 |
| EP | 0823718 A2 | 2/1998 | H01G/4/12 |
| EP | 0865157 A2 | 9/1998 | H03H/9/17 |
| WO | 9816957 A1 | 4/1998 | H01L/41/08 |

* cited by examiner

*Primary Examiner*—Robert Pascal
*Assistant Examiner*—Dean Takaoka
(74) *Attorney, Agent, or Firm*—Steven R. Biren (57) ABSTRACT

The invention describes a filter arrangement as well as an electronic component, each with a bulk acoustic wave resonator unit which is present on a carrier substrate (1). A reflection element (2) is provided between the carrier substrate (1) and the bulk acoustic wave resonator unit for the purpose of acoustic insulation of the generated oscillations. This reflection element (2) may consist either of several layers of alternately high and low impedance or, if the acoustically reflecting substance has a sufficiently low impedance, of a single layer. In addition, a mobile telephone device, a transmitter, a receiver, and a wireless data transmission system as well as a method of manufacturing an electronic component are described.

12 Claims, 4 Drawing Sheets

BULK ACOUSTIC WAVE FILTER

BACKGROUND OF THE INVENTION

The invention relates to a filter arrangement with a carrier substrate, a resonator unit, and a reflection element between the carrier substrate and the resonator unit. The invention also relates to an electronic component with a carrier substrate, a resonator unit, and a reflection element between the carrier substrate and the resonator unit, as well to as a method of manufacturing such a component.

The extremely fast developments in the field of mobile telephony and the continuous miniaturization of cordless telephone equipment lead to increased requirements imposed on the individual components. Thus a high selectivity in the high-frequency range is necessary for protecting the receiver from the increasing number of potential interfering signals from other systems.

At the moment, filters with ceramic electromagnetic resonators are used for this purpose in the high-frequency range. A miniaturization of these filters, however, is restricted by the electromagnetic wavelength. Surface acoustic wave (SAW) filters can be constructed so as to be substantially smaller. The reason for this is that the acoustic wavelength is smaller by 4 to 5 orders of magnitude than the electromagnetic wavelength. A disadvantage is, however, that surface acoustic wave filters often have a complicated construction and have to be protected by means of complicated housings.

An alternative is formed by bulk acoustic wave (BAW) filters. Bulk acoustic wave filters have advantages as regards their size, power, and IC compatibility. Bulk acoustic wave filters can be realized with widely varying types of bulk acoustic wave resonators. Thus, for example, single-crystal resonators, resonators with membranes, or resonators with air gaps may be used.

In principle, bulk acoustic wave resonators are built up from three components. The first component generates the acoustic wave and comprises a piezoelectric layer. Two electrodes, which are arranged above and below the piezoelectric layer, represent the second component. The third component has the task of acoustically insulating the carrier substrate from the oscillations generated by the piezoelectric layer.

A possibility for acoustic insulation is formed by reflection layers which are provided between the carrier substrate and the resonator unit. Such reflection layers consist of layers having alternately a high and a low acoustic impedance. The thickness of an individual layer is one fourth of the resonance wavelength. These layers have the purpose of reflecting the acoustic waves at the respective boundary surfaces as well as possible, and thus keeping the acoustic energy inside the resonator unit. The number of layers required depends on the one hand on the differences in acoustic impedance between the individual layers and on the other hand on the resonator quality Q to be achieved.

The individual reflection layers may be made from a wide variety of materials. A material of low acoustic impedance which is often used is $SiO_2$ with an acoustic impedance of 13 $Ggm^{-2}s^{-1}$. AlN with an acoustic impedance of 34 $Ggm^{-2}s^{-1}$, W with an acoustic impedance of 101 $Ggm^{-2}s^{-1}$, and $HfO_2$ with an acoustic impedance of 40 $Ggm^{-2}s^{-1}$ are used as materials in layers having a high acoustic impedance.

A bulk acoustic wave resonator is known from WO 98/16957 in which polymers such as, for example, polyimide are used as materials of low acoustic impedance in the reflection layers. The number of reflection layers necessary for acoustic insulation can be reduced owing to a low acoustic impedance of 2 $Ggm^{-2}s^{-1}$.

SUMMARY OF THE INVENTION

The invention has for its object to provide an improved bulk acoustic wave filter.

This object is achieved with a filter arrangement with a carrier substrate, a resonator unit, and a reflection element between the carrier substrate and the resonator unit which is characterized in that the reflection element comprises a layer of an acoustically reflecting substance.

Preferably, the acoustically reflecting substance belongs to the group of polymers and porous substances.

Porous or polymer acoustically reflecting substances have low acoustic impedance values and thus render it possible for only one layer to suffice for reflecting the total acoustic energy. The condition that the thickness of the layer should be one fourth of the resonance wavelength can even be dropped in this case. This simplifies the construction and renders the manufacture of the filter arrangement less expensive.

It is particularly preferred that the acoustically reflecting substance is an aerogel, a xerogel, a glass foam, a foam-type adhesive, a foamed synthetic resin, or a synthetic resin of low density.

The advantage of these materials is that they have extremely low impedance values of down to $10^{-2}$ $Ggm^{-2}s^{-1}$, depending on the material used. The acoustic impedance thus lies only two orders of magnitude above the acoustic impedance of air ($4 \cdot 10^{-4}$ $Ggm^{-2}s^{-1}$) in the most favorable case.

It may be preferred that the reflection element comprises layers of alternately high and low acoustic impedance, with an acoustically reflecting substance being used for any layer of low acoustic impedance.

Only very few layers are necessary in the reflection element for reflecting the total acoustic energy owing to the low acoustic impedance values of polymers and porous acoustically reflecting substances.

It is preferred that the material of high impedance comprises $HfO_2$, Mo, Au, Ni, Cu, W, Ti/W/Ti, $W_xTi_{1-x}$ ($0 \leq x \leq 1$), diamond, $Ta_2O_5$, Pt, Ti/Pt, or a synthetic resin of high density.

The material may be provided in thin-film processes such as reactive sputtering or vacuum deposition processes such as, for example, chemical vapor deposition (CVD), physical chemical vapor deposition (PCVD), or spin coating.

It is furthermore preferred in this filter arrangement that the thickness of the layers is one fourth of the resonance wavelength each time.

The reflections of each layer will combine in phase in the resonance wavelength in a sequence of layers of alternately high and low impedance which is combined with layer thicknesses of one fourth of the resonance wavelength.

It may be preferred that a further reflection element is arranged on the resonator unit.

The provision of a further reflection element on the resonator unit on the one hand has the advantage that no acoustic vibrations reach the upper side of the filter arrangement. On the other hand, the reflection elements protect the resonator unit from contamination with dust particles and the like. The provision of reflection elements above and below the resonator unit, which in the most favorable case consist of only one layer, is cheaper than other protection techniques such as, for example, a semi-hermetic envelope.

It is also preferred that a protective layer of an organic and/or inorganic material is provided over the filter arrangement.

The filter arrangement is protected from mechanical loads and corrosion through moisture by the protective layer.

It is preferred that the carrier substrate comprises a ceramic material, a ceramic material with a glass planarizing layer, a glass-ceramic material, a glass material, silicon, GaAs, or sapphire.

A carrier substrate of a ceramic material, a ceramic material with a glass planarizing layer, a glass-ceramic material, or a glass material can be inexpensively manufactured and the process cost for these components can be kept low. If the filter arrangement is to be integrated into an IC, the carrier substrate made of a semiconductor material may possibly be provided with a passivating layer, for example of $SiO_2$ or glass.

It is furthermore preferred that the resonator unit comprises a piezoelectric layer of $PbZr_{0.15}Ti_{0.85}O_3$ doped with 2% lanthanum.

$PbZr_{0.15}Ti_{0.85}O_3$ doped with 2% lanthanum has particularly good piezoelectric properties in the filter arrangement.

It may be preferred that an adhesive layer is arranged between the carrier substrate and the reflection element.

This layer serves to fasten the reflection element on the carrier substrate.

The invention further relates to mobile telephone appliances, transmitters, receivers, and wireless data transmission systems which are fitted with a filter arrangement comprising a carrier substrate, a resonator unit, and a reflection element between the carrier substrate and the resonator unit, wherein the reflection element comprises a layer of an acoustically reflecting substance.

The invention also relates to an electronic component with a carrier substrate, a resonator unit, and a reflection element between the carrier substrate and the resonator unit, wherein the reflection element comprises a layer of an acoustically reflecting substance.

Inexpensive components such as, for example, bulk acoustic wave resonators can be manufactured with the use of polymers and porous acoustically reflecting substances of extremely low impedance as the reflection elements. A reduction in the manufacturing cost is achieved first in that only one layer need be provided for the reflection element and in addition in that this layer need not necessarily have a layer thickness of one fourth of the resonance wavelength.

The invention further relates to a method of manufacturing an electronic component with a carrier substrate, a resonator unit, and a reflection element made from an acoustically reflecting substance, in which method a resonator unit is provided on a substrate layer, a reflection element of an acoustically reflecting substance is provided on the resonator unit, and a carrier substrate is fastened on the reflection element, and the substrate layer is removed.

BRIEF DESCRIPTION OF THE DRAWING

The invention will be explained in more detail below with reference to four Figures and eight embodiments, in which.

DESCRIPTION OF THE PREFERRED EMBODIMENTS

Figure 1:
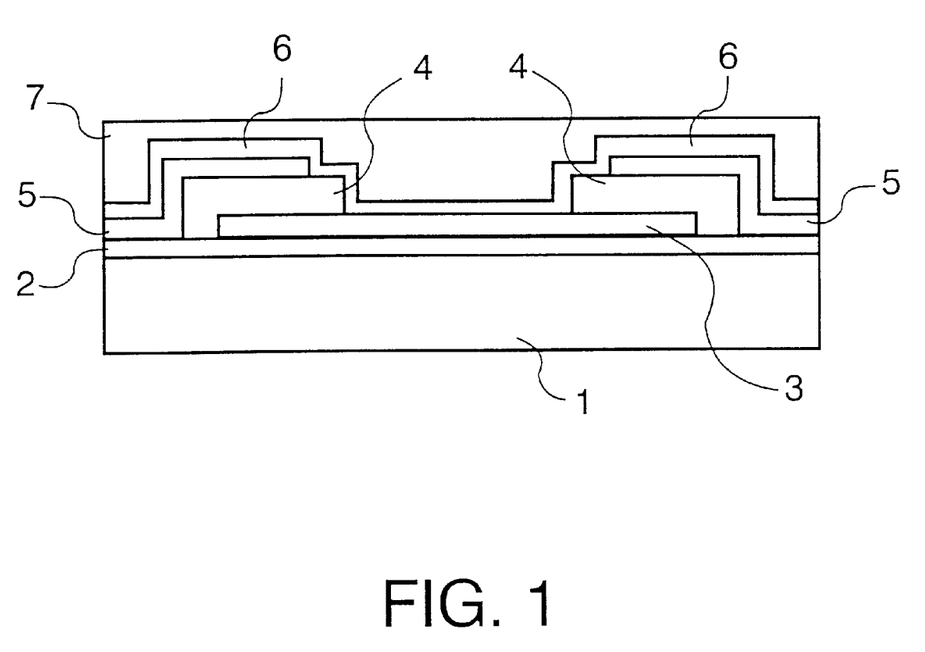
FIG. 1 shows the construction of an embodiment of a bulk acoustic wave filter arrangement in cross-section.

In FIG. 1, a bulk acoustic wave filter arrangement comprises a carrier substrate 1 which is made, for example, from a ceramic material, a ceramic material with a glass planarizing layer, a glass-ceramic material, a glass material, silicon, GaAs, or sapphire. If silicon or GaAs is used as the carrier substrate 1, a passivating layer of, for example, $SiO_2$ or glass is additionally provided. A first reflection element 2, which is a layer of an acoustically reflecting substance from the group comprising polymers and porous substances, is present on the carrier substrate 1. Acoustically reflecting substances which may be used are, for example, an aerogel, a xerogel, a glass foam, a foam-type adhesive, a foamed synthetic resin, or a synthetic resin of low density. An aerogel which may be used is, for example, an inorganic aerogel made of silica gel, or porous $SiO_2$ structures, or an organic aerogel such as, for example, a resorcin-formaldehyde aerogel, a melamine-formaldehyde aerogel, or a phenol-formaldehyde aerogel. A xerogel which may be used is, for example, an inorganic xerogel such as highly condensed polysilicic acid or an organic xerogel such as glue or agar-agar. Foamed substances which may be used are chemically foamed or physically foamed polymers such as, for example, polystyrol, polycarbonate, polyvinylchloride, polyurethane, polyisocyanate, polyisocyanurate, polycarbodiimide, polymethacrylimide, polyacrylimide, acryl-butadiene-styrol copolymers, polypropylene, or polyester. Furthermore, foamed synthetic resins such as, for example, phenol-formaldehyde resins or furane resins may be used, which have a high porosity owing to carbonization. A synthetic resin of low density which may be used is, for example, a cross-linked polyvinylether, a cross-linked polyarylether, polytetrafluoroethylene, poly(p-xylylene), poly(2-chloro-p-xylylene), poly(dichloro-p-xylylene), polybenzocyclobutene, a styrol-butadiene copolymer, an ethylene-vinylacetate polymer, or an organic siloxane polymer. Two resonator units are provided on the first reflection element 2, each having a first electrode 3, a piezoelectric layer 4, and a second electrode 5. The electrodes 3 and 5 are preferably made from a well conducting material of low acoustic damping and may comprise, for example, $Ag_{1-x}Pt_x$ ($0 \leq x \leq 1$), Pt (50 nm to 1 $\mu$m), Ti (1 to 20 nm)/Pt (20 to 600 nm), Ti (1 to 20 nm)/Pt (20 to 600 nm)/Ti (1 to 20 nm), Al, Al doped with a few percents of Cu, Al doped with a few percents of Si, Al doped with a few percents of Mg, W, Ni, Mo, Au, Cu, Ti/Pt/Al, Ti/Ag, Ti/Ag/Ti, Ti/Ag/Ir, Ti/Ir, Ti/Pd, Ti/$Ag_{1-x}Pt_x$ ($0 \leq x \leq 1$), Ti/$Ag_{1-x}Pd_x$ ($0 \leq x \leq 1$), Ti/$Pt_{1-x}Al_x$ ($0 \leq x \leq 1$), $Pt_{1-x}Al_x$ ($0 \leq x \leq 1$), Ti/Ag/$Pt_{1-x}Al_x$ ($0 \leq x \leq 1$), Ti/Ag/Ru, Ti/Ag/Ir/$IrO_x$ ($0 \leq x \leq 2$), Ti/Ag/Ru/$RuO_x$ ($0 \leq x \leq 2$), Ti/Ag/Ru/$Ru_xPt_{1-x}$ ($0 \leq x \leq 1$), Ti/Ag/Ru/$Ru_xPt_{1-x}$/$RuO_y$ ($0 \leq x \leq 1$, $0 \leq y \leq 2$), Ti/Ag/Ru/$RuO_x$/$Ru_yPt_{1-y}$ ($0 \leq x \leq 2$, $0 \leq y \leq 1$), Ti/Ag/$Ru_xPt_{1-x}$ ($0 \leq x \leq 1$), Ti/Ag/$Pt_xAl_{1-x}$ ($0 \leq x \leq 1$), $Pt_xAl_{1-x}$/Ag/$Pt_yAl_{1-y}$ ($0 \leq x \leq 1$, $0 \leq y \leq 1$), Ti/Ag/$Pt_y(RhO_x)_{1-y}$ ($0 \leq x \leq 2$, $0 \leq y \leq 1$), Ti/Ag/Rh/$RhO_x$ ($0 \leq x \leq 2$), Ti/Ag/$Pt_xRh_{1-x}$ ($0 \leq x \leq 1$), Rh, Rh/$RhO_2$, Ti/Ag/$Pt_y(RhO_x)_{1-y}$/$Pt_zRh_{1-z}$ ($0 \leq x \leq 2$, $0 \leq y \leq 1$, $0 \leq z \leq 1$), Ti/$Ag_xPt_{1-x}$/Ir ($0 \leq x \leq 1$), Ti/$Ag_xPt_{1-x}$/Ir/$IrO_y$ ($0 \leq x \leq 1$, $0 \leq y \leq 2$), Ti/$Ag_xPt_{1-x}$/$Pt_yAl_{1-y}$ ($0 \leq x \leq 1$, $0 \leq y \leq 1$), Ti/$Ag_xPt_{1-x}$/Ru ($0 \leq x \leq 1$), Ti/$Ag_xPt_{1-x}$/Ru/$RuO_y$ ($0 \leq x \leq 1$, $0 \leq y \leq 2$), Ti/Ag/Cr, Ti/Ag/Ti/ITO, Ti/Ag/Cr/ITO, Ti/Ag/ITO, Ti/Ni/ITO, Ti/Ni/Al/ITO, Ti/Ni, Ti/W/Ti, $W_xTi_{1-x}$ $(0 \leq x \leq 1)$, $W_xTi_{1-x}/Al(Cu)(0 \leq x \leq 1)$, $W_xTi_{1-x}/Al(Si)$ $(0 \leq x \leq 1)$, $W_xTi_{1-x}/Al(0 \leq x \leq 1)$, or Ti/Cu. The material used for the piezoelectric layer 4 may be, for example, AlN, ZnO, $PbTi_{1-x}Zr_xO_3$ $(0 \leq x \leq 1)$ with and without dopants of La or Mn, $LiNbO_3$, $LiTaO_3$, $PbNb_2O_6$, or polyvinylidene fluoride (PVDF). A second reflection element 6, for example a layer of an aerogel, a xerogel, a glass foam, a foam-type adhesive, a foamed synthetic resin, or a synthetic resin of low density, is provided on portions of the first electrode 3 and of the second electrode 5 as well as of the piezoelectric layer 4. Alternatives for the construction are familiar to those skilled in the art. A protective layer 7 of an organic and/or inorganic material is provided over the entire filter arrangement. The organic material used may be, for example, polybenzocyclobutene or polyimide, and the inorganic material used may be, for example $Si_3N_4$, $SiO_2$, or $Si_xO_yN_z$ $(0 \leq x \leq 1, 0 \leq y \leq 1, 0 \leq z \leq 1)$.

Alternatively, the reflection elements 2 and 6 may consist of several layers of alternately high and low impedance. The material of low impedance may then be, for example, an organic or inorganic aerogel, an organic or inorganic xerogel, a glass foam, a foam-type adhesive, a foamed synthetic resin, or a synthetic resin of low density. Materials of high acoustic impedance maybe, for example, $HfO_2$, Mo, Au, Ni, Cu, W, Ti/W/Ti, $W_xTi_{1-x}$ $(0 \leq x \leq 1)$, diamond, $Ta_2O_5$, Pt, Ti/Pt, or a synthetic resin of high density such as, for example, high-density polyethylene (HDPE).

In a further embodiment of the invention, furthermore, the second reflection element 6 and/or the protective layer 7 may be omitted.

A further alternative is that an additional adhesive layer, for example made of an acrylate glue or an epoxide glue, is provided between the reflection element 2 and the carrier substrate 1. The acrylate glue may comprise, for example, acryl or methacryl monomers which polymerize during the adhesion process.

Furthermore, a layer of $SiO_2$ with a layer thickness of between 30 and 300 nm may be provided above and/or below a reflection element 2 made of porous $SiO_2$.

Moreover, the filter arrangement may be provided with at least one first and one second current supply contact. For example, an electroplated SMD end contact of Cr/Cu, Ni/Sn, or Cr/Cu, Cu/Ni/Sn, or Cr/Ni, Pb/Sn, or a bump end contact, or a contact surface may be used as the current supply contact.

Figure 2:
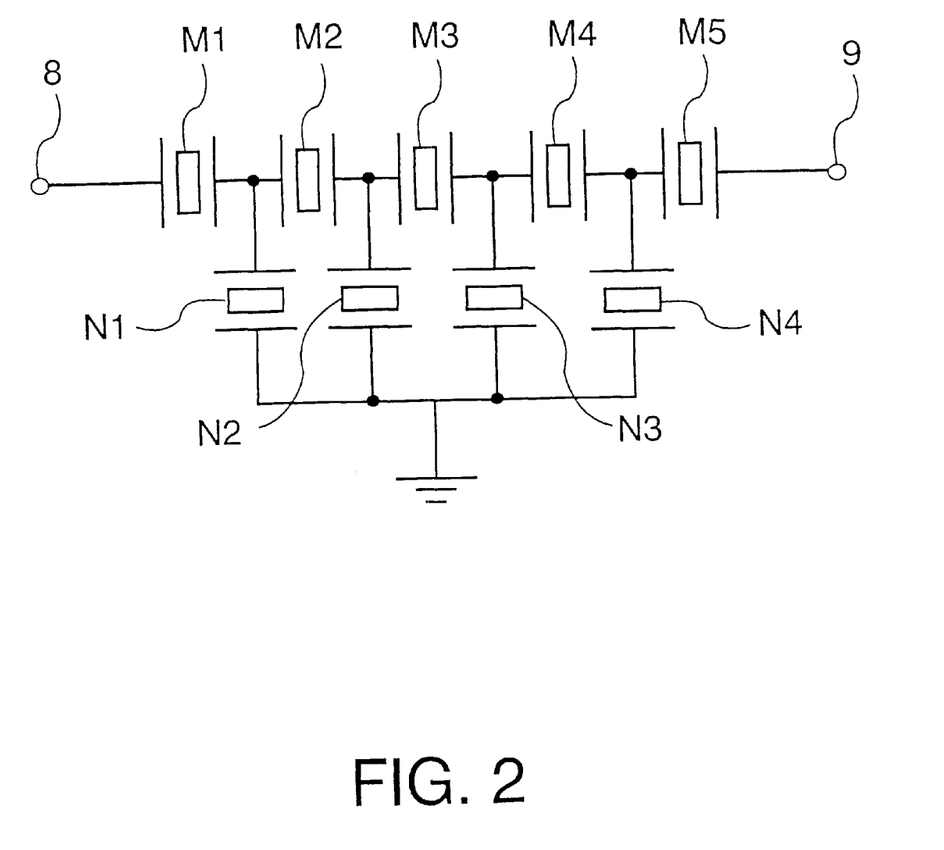
FIG. 2 shows the circuit diagram of a bulk acoustic wave filter arrangement.

FIG. 2 shows a filter arrangement of a total of nine resonator units M1 to M5 and N1 to N4. Five resonator units M1 to M5 are connected in series between an input 8 and an output 9. Four further resonator units N1 to N4 are connected in parallel to said five resonator units M1 to M5. One terminal of each of the four resonator units N1 to N4 is connected to ground potential. The other terminal of the resonator unit N1 is connected between the resonator units M1 and M2. The other terminal of the resonator unit N2 is connected between the resonator unit M2 and M3. The other terminal of the resonator unit N3 is connected between the resonator units M3 and M4, and finally, the other terminal of the resonator unit N4 is connected between the resonator units M4 and M5.

Figure 3:
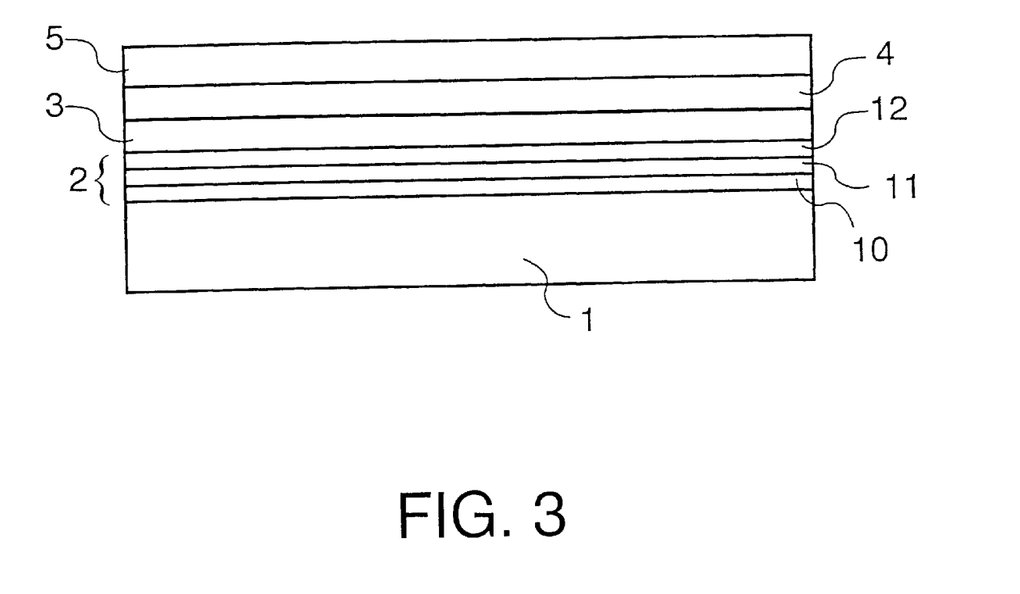
FIG. 3 shows a bulk acoustic wave resonator with two reflection elements in cross-section.

In FIG. 3, an electronic component comprises a carrier substrate 1 which is made, for example, from a ceramic material, a ceramic material with a glass planarizing layer, a glass-ceramic material, silicon, GaAs, or sapphire. If silicon or GaAs is used as the carrier substrate 1, an additional passivating layer of, for example, $SiO_2$ or glass is provided. A reflection element 2 with several layers is provided on the carrier substrate 1, i.e. with a bottom layer 10, a central layer 11, and an upper layer 12. The individual layers have a layer thickness of one fourth of the resonance wavelength. The bottom layer 10 and the upper layer 12 are made from a material of low acoustic impedance and comprise an acoustically reflecting substance from the group of polymers and porous substances. The stically reflecting substance used may be, for example, an aerogel, a xerogel, a glass foam, a foam-type adhesive, a foamed synthetic resin, or a synthetic resin of low density. The aerogel used may be, for example, an inorganic aerogel made of silica gel or porous $SiO_2$ structures, or an organic aerogel such as, for example, a resorcin-formaldehyde aerogel, a melamine-formaldehyde aerogel, or a phenol-formaldehyde aerogel. The xerogel used may be, for example, an inorganic xerogel such as highly condensed polysilicic acid or an organic kerogel such as glue or agar-agar. Foamed substances may be chemically foamed or physically foamed polymers such as, for example, polystyrol, polycarbonate, polyvinylchloride, polyurethane, polyisocyanate, polyisocyanurate, polycarbodiimide, polymethacrylimide, polyacrylimide, acryl-butadiene-styrol copolymers, polypropylene, or polyester. In addition, foamed synthetic resins such as, for example, phenol-formaldehyde resins or furane resins may be used, which have a high porosity owing to carbonization. A synthetic resin of low density which is used may be, for example, a cross-linked polyvinyl ether, a cross-linked polyaryl ether, polytetrafluoroethylene, poly(p-xylylene), poly(2-chloro-p-xylylene), poly(dichloro-p-xylylene), polybenzocyclobutene, a styrol-butadiene copolymer, an ethylene-vinylacetate polymer, or an organic polysiloxane polymer. The acoustic impedance of the central layer 11 is higher than the acoustic impedances of the bottom layer 10 and the top layer 12. The central layer 11 is made of a material having a high acoustic impedance such as, for example, $HfO_2$, Mo, Au, Ni, Cu, W, Ti/W/Ti, $W_xTi_{1-x}$, diamond, $Ta_2O_5$, Pt, Ti/Pt, or a synthetic resin of high density such as, for example, high-density polyethylene (HDPE). A first electrode 3, a piezoelectric layer 4, and a second electrode 5 are provided on the upper layer 12. The electrodes 3 and 5 are preferably made from a well conducting material of low acoustic damping and may comprise, for example, $Ag_{1-x}Pt_x$ $(0 \leq x \leq 1)$, Pt (50 nm to 1 $\mu$m), Ti (1 to 20 nm)/Pt (20 to 600 nm), Ti (1 to 20 nm)/Pt (20 to 600 nm)/Ti (1 to 20 nm), Al, Al doped with a few percents of Cu, Al doped with a few percents of Si, Al doped with a few percents of Mg, Ni, W, Mo, Au, Cu, Ti/Pt/Al, Ti/Ag, Ti/Ag/Ti, Ti/Ag/Ir, Ti/Ir, Ti/Pd, $Ti/Ag_{1-x}Pt_x$ $(0 \leq x \leq 1)$, $Ti/Ag_{1-x}Pd_x$ $(0 \leq x \leq 1)$, $Ti/Pt_{1-x}Al_x$ $(0 \leq x \leq 1)$, $Pt_{1-x}Al_x$ $(0 \leq x \leq 1)$, $Ti/Ag/Pt_{1-x}Al_x$ $(0 \leq x \leq 1)$, Ti/Ag/Ru, $Ti/Ag/Ir/IrO_x$ $(0 \leq x \leq 2)$, $Ti/Ag/Ru/RuO$, $(0 \leq x \leq 2)$, $Ti/Ag/Ru/Ru_xPt_{1-x}$ $(0 \leq x \leq 1)$, $Ti/Ag/Ru/Ru_xPt_{1-x}/RuO_y$ $(0 \leq x \leq 1, 0 \leq y \leq 2)$, $Ti/Ag/Ru/RuO_x/Ru_yPt_{1-y}$ $(0 \leq x \leq 2, 0 \leq y \leq 1)$, $Ti/Ag/Ru_xPt_{1-x}$ $(0 \leq x \leq 1)$, $Ti/Ag/Pt_xAl_{1-x}$ $(0 \leq x \leq 1)$, $Pt_xAl_{1-x}/Ag/Pt_yAl_{1-y}$ $(0 \leq x \leq 1, 0 \leq y \leq 1)$, $Ti/Ag/Pt_y(RhO_x)_{1-y}$ $(0 \leq x \leq 2, 0 \leq y \leq 1)$, $Ti/Ag/Rh/RhO_x$ $(0 \leq x \leq 2)$, Rh, $Rh/RhO_2$, $Ti/Ag/Pt_xRh_{1-x}$ $(0 \leq x \leq 1)$, $Ti/Ag/Pt_y(RhO_x)_{1-y}/Pt_zRh_{1-z}$ $(0 \leq x \leq 2, 0 \leq y \leq 1, 0 \leq z \leq 1)$, $Ti/Ag_xPt_{1-x}/Ir$ $(0 \leq x \leq 1)$, $Ti/Ag_xPt_{1-x}/Ir/IrO_y$ $(0 \leq x \leq 1, 0 \leq y \leq 2)$, $Ti/Ag_xPt_{1-x}/Pt_yAl_{1-y}$ $(0 \leq x \leq 1, 0 \leq y \leq 1)$, $Ti/Ag_xPt_{1-x}/Ru$ $(0 \leq x \leq 1)$, $Ti/Ag_xPt_{1-x}/Ru/RuO_y$ $(0 \leq x \leq 1, 0 \leq y \leq 2)$, Ti/Ag/Cr, Ti/Ag/Ti/ITO, Ti/Ag/Cr/ITO, Ti/Ag/ITO, Ti/Ni/ITO, Ti/Ni/Al/ITO, Ti/Ni, Ti/W/Ti, $W_xTi_{1-x}$ $(0 \leq x \leq 1)$, $W_xTi_{1-x}/Al(Cu)$ $(0 \leq x \leq 1)$, $W_xTi_{1-x}/Al(Si)(0 \leq x \leq 1)$, $W_xTi_{1-x}/Al$ $(0 \leq x \leq 1)$, or Ti/Cu. The material used for the piezoelectric layer 4 may be, for example, AlN, ZnO, $PbTi_{1-x}Zr_xO_3$ $(0 \leq x \leq 1)$ with or without dopants of La or Mn, $LiNbO_3$, LiTaO$_3$, PbNb$_2$O$_6$, Pb$_{1-x}$Ca$_x$TiO$_3$ ($0 \leq x \leq 1$), [Pb(Mg$_{1/3}$Nb$_{2/3}$)O$_3$]$_x$-[PbTiO$_3$]$_{1-x}$ ($0 \leq x \leq 1$), BaTiO$_3$, K$_{1-x}$Na$_x$NbO$_3$ ($0 \leq x \leq 1$), (Cd,Na)NbO$_3$, (Bi,Na)TiO$_3$, (Bi,Na,Pb,Ba)TiO$_3$, Bi$_7$Ti$_4$NbO$_{21}$, (Ba$_{1-x}$Sr$_x$)$_2$NaNb$_5$O$_{15}$ ($0 \leq x \leq 1$), (Ba$_{1-x}$Sr$_x$)$_2$KNb$_5$O$_{15}$ ($0 \leq x \leq 1$), a) Pb(Mg$_{1/2}$W$_{1/2}$)O$_3$,
b) Pb(Fe$_{1/2}$Nb$_{1/2}$)O$_3$,
c) Pb(Fe$_{2/3}$W$_{1/3}$)O$_3$,
d) Pb(Ni$_{1/3}$Nb$_{2/3}$)O$_3$,
e) Pb(Zn$_{1/3}$Nb$_{2/3}$)O$_3$,
f) Pb(Sc$_{1/2}$Ta$_{1/2}$)O$_3$, combinations of the compounds a) to f) with PbTiO$_3$, and Pb(Mg$_{1/3}$Nb$_{2/3}$)O$_3$ with and without excess lead, or polyvinylidene fluoride (PVDF).

Alternatively, a further reflection element 6 may be provided on the second electrode 5, which element comprises either a layer of a material of extremely low acoustic impedance or several layers of alternately high and low impedance.

It is also possible for the reflection element 2 to comprise only a single layer, which need not necessarily have a layer thickness of one fourth of the resonance wavelength, or more than three layers.

Furthermore, a layer of SiO$_2$ with a layer thickness of between 30 and 300 nm may be provided above and below a reflection element 2 of porous SiO$_2$.

Furthermore, a protective layer of an organic and/or inorganic material may be provided over the entire component. The organic material used may be, for example, polybenzocyclobutene or polyimide, and the inorganic material used may be, for example, Si$_3$N4, SiO$_2$, or Si$_x$O$_y$N$_z$ ($0 \leq x \leq 1$, $0 \leq y \leq 1$, $0 \leq z \leq 1$).

In a further alternative embodiment, an additional adhesive layer, for example of an acrylate glue or an epoxide glue, is provided between the reflection element 2 and the carrier substrate 1. The acrylate glue may comprise, for example, acryl or methacryl monomers which polymerize during the adhesion process.

At least one first and one second current supply contact may be provided on mutually opposed sides of the electronic component. Current supply contacts used may be, for example, an electroplated SMD end contact of Cr/Cu, Ni/Sn, or Cr/Cu, Cu/Ni/Sn, or Cr/Ni, Pb/Sn, or a bump end contact, or a contact surface.

The component manufactured may be, for example, a bulk acoustic wave resonator. Several of these bulk acoustic wave resonators may be joined together into a bulk acoustic wave filter arrangement.

Figure 4:
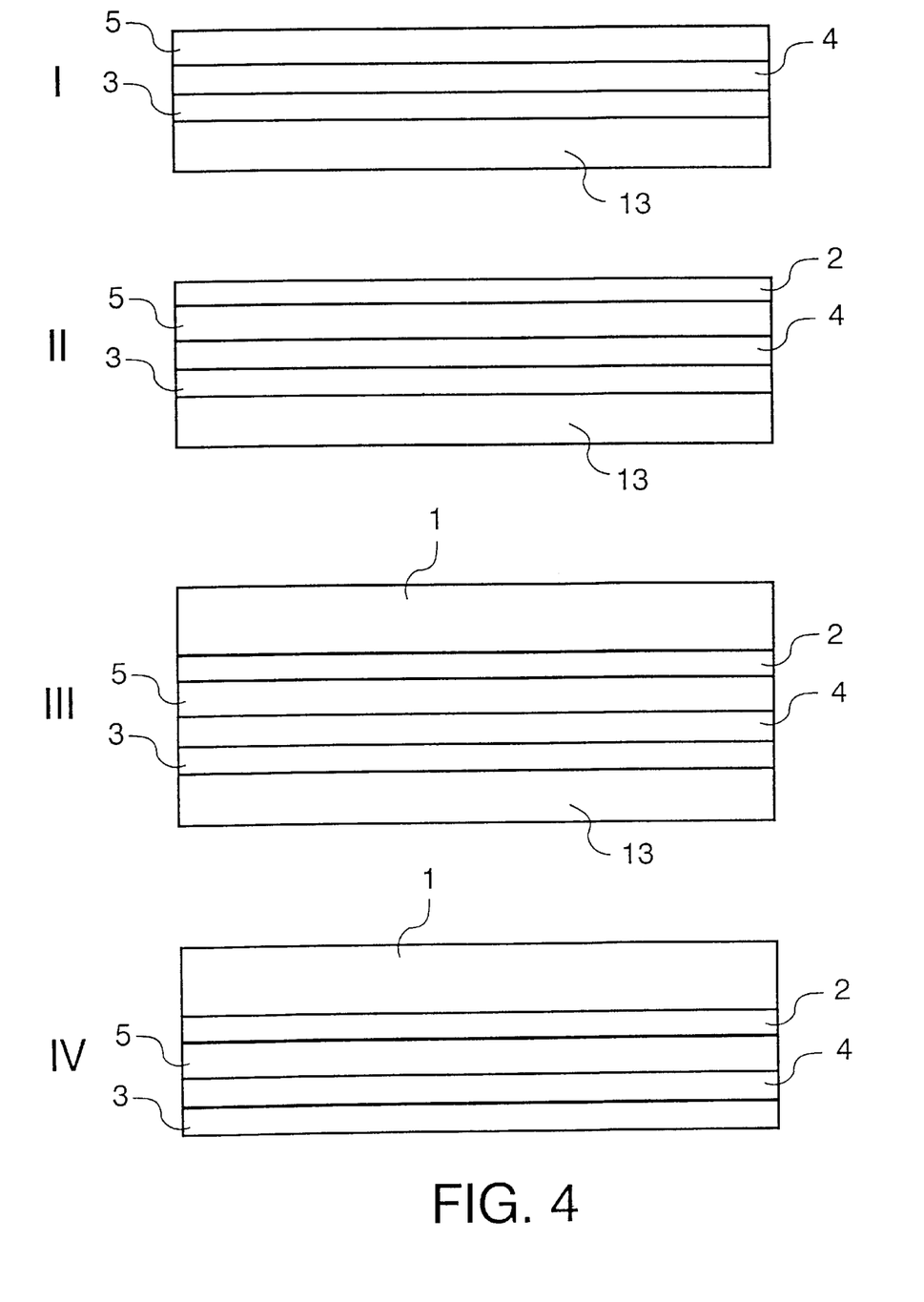
FIG. 4 is a flow chart representing the manufacture of a bulk acoustic wave resonator.

FIG. 4 shows a possibility for manufacturing an electronic component according to the invention, where in a first step a resonator unit comprising a first electrode 3, a piezoelectric layer 4, and a second electrode 5 is deposited on a substrate layer 13 (step I in FIG. 4). The substrate layer 13 may be made, for example, from a ceramic material, a ceramic material with a glass planarizing layer, a glass-ceramic material, silicon, GaAs, or sapphire. A passivating layer of, for example, SiO$_2$ or glass is additionally provided if silicon or GaAs is used in the substrate layer 13. The electrodes 3 and 5 are preferably made from a well conducting material of low acoustic damping and may comprise, for example, Ag$_{1-x}$Pt$_x$ ($0 \leq x \leq 1$), Pt (50 nm to 1 μm), Ti (1 to 20 nm)/Pt (20 to 600 nm), Ti (1 to 20 nm)/Pt (20 to 600 nm)/Ti (1 to 20 nm), Al, Al doped with a few percents of Cu, Al doped with a few percents of Si, Al doped with a few percents of Mg, Ni, W, Mo, Au, Cu, Ti/Pt/Al, Ti/Ag, Ti/Ag/Ti, Ti/Ag/Ir, Ti/Ir, Ti/Pd, Ti/Ag$_{1-x}$Pt$_x$ ($0 \leq x \leq 1$), Ti/Ag$_{1-x}$Pd$_x$ ($0 \leq x \leq 1$), Ti/Pt$_{1-x}$Al$_x$ ($0 \leq x \leq 1$), Pt$_{1-x}$Al$_x$ ($0 \leq x \leq 1$), Ti/Ag/Pt$_{1-x}$Al$_x$ ($0 \leq x \leq 1$), Ti/Ag/Ru, Ti/Ag/Ir/IrO$_x$ ($0 \leq x \leq 2$), Ti/Ag/Ru/RuO$_x$ ($0 \leq x \leq 2$), Ti/Ag/Ru/Ru$_x$Pt$_{1-x}$ ($0 \leq x \leq 1$), Ti/Ag/Ru/Ru$_x$Pt$_{1-x}$/RuO$_y$ ($0 \leq x \leq 1$, $0 \leq y \leq 2$), Ti/Ag/Ru/RuO$_x$/Ru$_y$Pt$_{1-y}$ ($0 \leq x \leq 2$, $0 \leq y \leq 1$), Ti/Ag/Ru$_x$Pt$_{1-x}$ ($0 \leq x \leq 1$), Ti/Ag/Pt$_x$Al$_{1-x}$ ($0 \leq x \leq 1$), Pt$_x$Al$_{1-x}$/Ag/Pt$_y$Al$_{1-y}$ ($0 \leq x \leq 1$, $0 \leq y \leq 1$), Ti/Ag/Pt$_y$(RhO$_x$)$_{1-y}$ ($0 \leq x \leq 2$, $0 \leq y \leq 1$), Ti/Ag/Rh/RhO$_x$ ($0 \leq x \leq 2$), Ti/Ag/Pt$_x$Rh$_{1-x}$ ($0 \leq x \leq 1$), Rh, Rh/RhO$_2$, Ti/Ag/Pt$_y$(RhO$_x$)$_{1-y}$/Pt$_z$Rh$_{1-z}$ ($0 \leq x \leq 2$, $0 \leq y \leq 1$, $0 \leq z \leq 1$), Ti/Ag$_x$Pt$_{1-x}$Ir ($0 \leq x \leq 1$), Ti/Ag$_x$Pt$_{1-x}$/Ir/IrO$_y$ ($0 \leq x \leq 1$, $0 \leq y \leq 2$), Ti/Ag$_x$Pt$_{1-x}$/Pt$_y$A$_{1-y}$ ($0 \leq x \leq 1$, $0 \leq y \leq 1$), Ti/Ag$_x$Pt$_{1-x}$/Ru ($0 \leq x \leq 1$), Ti/Ag$_x$Pt$_{1-x}$/Ru/RuO$_y$ ($0 \leq x \leq 1$, $0 \leq y \leq 2$), Ti/Ag/Cr, Ti/Ag/Ti/ITO, Ti/Ag/Cr/ITO, Ti/Ag/ITO, Ti/Ni/ITO, Ti/Ni/Al/ITO, Ti/Ni, Ti/W/Ti, W$_x$Ti$_{1-x}$ ($0 \leq x \leq 1$), W$_x$Ti$_{1-x}$/Al(Cu) ($0 \leq x \leq 1$), W$_x$Ti$_{1-x}$/Al(Si) ($0 \leq x \leq 1$), W$_x$Ti$_{1-x}$/Al ($0 \leq x \leq 1$), or Ti/Cu. The material used for the piezoelectric layer 4 may be, for example, AlN, ZnO, PbTi$_{1-x}$Zr$_x$O$_3$ ($0 \leq x \leq 1$) with and without dopants of La or Mn, LiNbO$_3$, LiTaO$_3$, PbNb$_2$O$_6$, Pb$_{1-x}$Ca$_x$TiO$_3$ ($0 \leq x \leq 1$), [Pb(Mg$_{1/3}$Nb$_{2/3}$)O$_3$]$_x$-[PbTiO$_3$]$_{1-x}$ ($0 \leq x \leq 1$), BaTiO$_3$, K$_{1-x}$Na$_x$NbO$_3$ ($0 \leq x \leq 1$), (Cd,Na)NbO$_3$, (Bi,Na)TiO$_3$, (Bi,Na,Pb,Ba)TiO$_3$, Bi$_7$Ti$_4$NbO$_{21}$, (Ba$_{1-x}$Sr$_x$)$_2$NaNb$_5$O$_{15}$ ($0 \leq x \leq 1$), (Ba$_{1-x}$Sr$_x$)$_2$KNb$_5$O$_{15}$ ($0 \leq x \leq 1$), a) Pb(Mg$_{1/2}$W$_{1/2}$)O$_3$,
b) Pb(Fe$_{1/2}$Nb$_{1/2}$)O$_3$,
c) Pb(Fe$_{2/3}$W$_{1/3}$)O$_3$,
d) Pb(Ni$_{1/3}$Nb$_{2/3}$)O$_3$,
e) Pb(Zn$_{1/3}$Nb$_{2/3}$)O$_3$,
f) Pb(Sc$_{1/2}$Ta$_{1/2}$)O$_3$, combinations of the compounds a) to f) with PbTiO$_3$ and Pb(Mg$_{1/3}$Nb$_{2/3}$)O$_3$ with and without excess lead, or polyvinylidene fluoride (PVDF).

A reflection element 2 made from an acoustically reflecting substance from the group of polymers and porous substances is provided on the second electrode 5 (step II in FIG. 4). The acoustically reflecting substance used may be, for example, an aerogel, a xerogel, a glass foam, a foam-type adhesive, a foamed synthetic resin, or a synthetic resin of low density. The aerogel may be, for example, an inorganic aerogel made of silica gel or porous SiO$_2$ structures, or an organic aerogel such as, for example, a resorcin-formaldehyde aerogel, a melamine-formaldehyde aerogel, or a phenol-formaldehyde aerogel. The xerogel used may be, for example, an inorganic xerogel such as highly condensed polysylicic acid, or an organic aerogel such as glue or agar-agar. The foamed synthetic resins may be chemically or physically foamed polymers such as, for example, polystyrol, polycarbonate, polyvinylchloride, polyurethane, polyisocyanate, polyisocyanurate, polycarbodiimide, polymethacrylimide, polyacrylimide, acryl-butadiene-styrol copolymers, polypropylene, or polyester. Furthermore, foamed synthetic resins such as, for example, phenol-formaldehyde resins or furane resins may be used, which have a high porosity through carbonization. The synthetic resin of low density used may be, for example, cross-linked polyvinyl ether, cross-linked polyaryl ether, polytetrafluoroethylene, poly(p-xylylene), poly(2-chloro-p-xylylene), poly(dichloro-p-xylylene), polybenzocyclobutene, styrol-butadiene copolymers, ethylene-vinylacetate polymers, or organic siloxane polymers. A carrier substrate 1 made from glass, a glass-ceramic material, a glass-ceramic material with a glass planarizing layer, a glass material, silicon, GaAs, or sapphire is fastened on this reflection element 2 by means of the adhesive properties of the material used or by means of an additional adhesive layer of, for example, an acrylate glue or an epoxide glue (step III in FIG. 4). If silicon or GaAs is used for the carrier substrate 1, an additional passivating layer, for example made of SiO$_2$ or glass, is provided. Then the substrate 13 is mechanically or chemically removed (step IV in FIG. 4).

If PbTi$_{1-x}$Zr$_x$O$_3$ (0≦x≦1) with and without dopants of La or Mn is used as the material for the piezoelectric layer 4, an anti-reaction layer of TiO$_2$, Al$_2$O$_3$, or ZrO$_2$ may be provided between the substrate layer 13 and the first electrode 3.

In an alternative method of manufacturing an electronic component according to the invention, the reflection element 2 is directly deposited on the desired carrier substrate 1. Subsequently, the resonator unit consisting of a first electrode 3, second electrode 5 and the piezoelectric layer 4 is provided. The reflection element 2 may alternatively comprise several layers of alternately high and low impedance.

In all cases, a protective layer 7 of an organic and/or inorganic material may be provided over the entire component. The organic material used may be, for example, polybenzocyclobutene or polyimide, and the inorganic material may be, for example, Si$_3$N$_4$, SiO$_2$, or Si$_x$O$_y$N$_z$ (0≦x≦1, 0≦y≦1, 0≦z≦1).

Alternatively, a reflection element may be provided below and above the resonator unit of the component. The further reflection element 6 either comprises a layer of a material having an extremely low acoustic impedance or several layers of alternately high and low impedance.

Furthermore, a layer of SiO$_2$ with a layer thickness of between 30 and 300 nm may be provided above and/or below a reflection element 2 or 6 of porous SiO$_2$.

At least one first and one second current supply contact may be provided at mutually opposed sides of the electronic component. Current supply contacts used may be, for example, an electroplated SMD end contact of Cr/Cu, Ni/Sn, or Cr/Cu, Cu/Ni/Sn, or Cr/Ni, Pb/Sn, or a bump end contact, or a contact surface.

Embodiments of the invention will be described in detail below, representing examples of how the invention may be realized.

Embodiment 1

First an adhesive layer of acrylate glue is deposited on a carrier substrate 1 of glass, and a layer of porous SiO$_2$ is deposited thereon as a reflection element 2. A first electrode 3 of Pt is deposited on a given portion of the reflection element 2. A piezoelectric layer 4 of AlN is provided on certain portions of the first electrode 3 and of the reflection element 2. A second electrode 5 of Al is deposited on certain portions of the piezoelectric layer 4 and of the reflection element 2. The piezoelectric layer 4 and the two electrodes 3, 5 are deposited and structured such that a filter arrangement in accordance with FIG. 2 comprising a total of nine resonator units M1 to M5 and N1 to N4 is created. Five resonator units M1 to M5 are connected in series, and the four further resonator units N1 to N4 are connected in parallel to these five resonator units M1 to M5. One terminal of each of the four resonator units N1 to N4 is connected to ground potential, whereas the other terminals of the resonator units N1 to N4 each lie between a respective pair of the five resonator units M1 to M5. A protective layer 7 of SiO$_2$ is provided over the entire filter arrangement. Contact holes to the second electrode 5 are opened through the protective layer 7 by means of etching. Bump end contacts of Cr/Cu are grown in the contact holes. The filter arrangement thus obtained is used as a bandpass filter in mobile telephones.

Embodiment 2

To realize a filter arrangement with a reflection element 2 comprising several layers, first an adhesive layer of acrylate glue is deposited on a carrier substrate I of glass, and a bottom layer 10 of porous SiO$_2$ is deposited thereon. A central layer 11 of Ta$_2$O$_5$ is deposited on the latter layer. An upper layer 12 of porous SiO$_2$ is subsequently provided on the central layer 11. A first electrode 3 of Mo is deposited on certain portions of the upper layer 12. A piezoelectric layer 4 of AlN is provided on certain portions of the first electrode 3 and of the upper layer 12. A second electrode S of Al is deposited on certain portions of the piezoelectric layer 4 and of the upper layer 12. The piezoelectric layer 4 and the two electrodes 3, 5 are deposited and structured such that a filter arrangement in accordance with FIG. 2 comprising a total of nine resonator units M1 to M5 and N1 to N4 is created. The five resonator units M1 to M5 are connected in series, and the four further resonator units N1 to N4 are connected in parallel to these five resonator units M1 to M5. One terminal of each of the four resonator units N1 to N4 is connected to ground potential, while the other terminals of the resonator unit N1 to N4 lie between respective pairs of the five resonator units M1 to M5. A protective layer 7 of SiO$_2$ is provided over the entire filter arrangement. Contact holes to the second electrode 5 are opened through the protective layer 7 by means of etching. Bump end contacts of Cr/Cu are grown in the contact holes. The filter arrangement thus obtained is used as a bandpass filter in mobile telephones.

Embodiment 3

To realize an electronic component with a reflection element 2 comprising several layers, first an adhesive layer of acrylate glue is provided on a glass carrier substrate 1, and a bottom layer 10 of porous SiO$_2$ is deposited thereon. A central layer 11 of Ta$_2$O$_5$ is deposited on the latter layer. An upper layer 12 of porous SiO$_2$ is subsequently provided on the central layer 11. A first electrode 3 of Pt is provided on the upper layer 12, and a piezoelectric layer 4 of PbZr$_{0.35}$Ti$_{0.65}$O$_3$ is deposited on the electrode. A second electrode 5 of Pt/Ti is provided on the piezoelectric layer 4. The entire component is provided with a protective layer of SiO$_2$. In addition, Cr/Cu, Ni/Sn SMD end contacts are fastened to mutually opposed sides of the components so as to serve as current supply contacts.

Embodiment 4

A bulk acoustic wave resonator is manufactured in that a resonator unit comprising a first electrode 3, a piezoelectric layer 4, and a second electrode 5 is provided on an Si substrate layer 13 with a passivating layer of SiO$_2$. The first electrode 3 comprises Ti/Pt, whereas the second electrode 5 is made of Pt. The piezoelectric layer 4 comprises AlN. In the next step, a layer of porous SiO$_2$ serving as the reflection element 2 is provided on the second electrode 5. A carrier substrate 1 of glass is fastened on this reflection element 2 by means of acrylate glue. Then the Si layer of the substrate layer 13 is etched away. Contact holes for contacting the first electrode 3 are etched into the remaining SiO$_2$ layer. Then bump end contacts of Cr/Cu are grown in the contact holes.

Embodiment 5

To manufacture a bulk acoustic wave resonator, a resonator unit comprising a first electrode 3, a piezoelectric layer 4, and a second electrode 5 is provided on a substrate 13 of Si with an SiO$_2$ passivating layer. The first electrode 3 comprises Ti/Pt, while the second electrode 5 is made of Pt. The piezoelectric layer 4 comprises PbZr$_{0.35}$Ti$_{0.65}$O$_3$. In the next step, a layer of porous SiO$_2$ is provided on the second electrode 5 so as to serve as the reflection element 2. A carrier substrate 1 of glass is fastened on this reflection element 2 by means of acrylate glue. Then the Si layer of the substrate 13 is etched away. Contact holes for contacting the first electrode 3 are etched into the remaining layer of SiO$_2$. Then bump end contacts of Cr/Cu are grown in the contact holes.

Embodiment 6

To manufacture a bulk acoustic wave resonator, a resonator unit comprising a first electrode 3, a piezoelectric layer 4, and a second electrode 5 is provided on a substrate 13 of Si with a passivating layer of SiO$_2$. The first electrode 3 comprises Ti/Pt and the second electrode 5 comprises Pt. The piezoelectric layer 4 comprises PbZr$_{0.15}$Ti$_{0.85}$O$_3$ and is manufactured in a spinning process. In the next step, a 30 nm thick layer of SiO$_2$, a reflection element 2 of porous SiO$_2$, and a 300 nm thick layer of SiO$_2$ are provided on the second electrode 5. A carrier substrate 1 of glass is fastened on this assembly by means of an acrylate glue. Subsequently, the Si layer of the substrate 13 is etched away. Contact holes for contacting the first electrode 3 are etched into the remaining layer Of SiO$_2$. Then bump end contacts of Cr/Cu are grown in the contact holes.

Embodiment 7

To manufacture a bulk acoustic wave resonator, a resonator unit comprising a first electrode 3, a piezoelectric layer 4, and a second electrode 5 is provided on a substrate 13 of Si with a passivating layer of SiO$_2$. The first electrode 3 comprises Ti/Pt, and the second electrode 5 comprises W$_{0.9}$Ti$_{0.1}$/Al(Cu). The piezoelectric layer 4 comprises PbZr$_{0.35}$Ti$_{0.65}$O$_3$ and is manufactured in a spinning process. In the next step, a 30 nm thick layer of SiO$_2$, a reflection element 2 of porous SiO$_2$, and a 300 nm thick layer of SiO$_2$ are provided on the second electrode 5. A glass carrier substrate 1 is fastened on this assembly by means of an acrylate glue. Then the Si layer of the substrate 13 is etched away. Contact holes for contacting the first electrode 3 are etched into the remaining layer of SiO$_2$. Then bump end contacts of Cr/Cu are grown in the contact holes.

Embodiment 8

To manufacture a bulk acoustic wave resonator, a resonator unit comprising a first electrode 3, a piezoelectric layer 4, and a second electrode 5 is provided on a substrate 11 of Si with an SiO$_2$ passivating layer. The first and second electrode each comprise Ti/Pt. The piezoelectric layer 4 comprises a PLZT layer with the composition PbZr$_{0.15}$Ti$_{0.85}$O$_3$ with 2% lanthanum doping. In the next step, a 30 nm thick layer of SiO$_2$, a reflection element 2 of porous SiO$_2$, and a 300 nm thick layer of SiO$_2$ are provided on the second electrode 5. A glass carrier substrate 1 is fastened on this assembly by means of an acrylate glue. Subsequently, the Si layer of the substrate 13 is etched away. Contact holes for contacting the first electrode 3 are etched into the remaining layer of SiO$_2$. Then bump end contacts of Cr/Cu are grown in the contact holes.

What is claimed is:

1. A filter arrangement with a carrier substrate (1), a resonator unit, and a reflection element (2) between the carrier substrate and the resonator unit, characterized in that the reflection element (2) consists of a unitary layer formed of an acoustically reflecting substance selected from the group consisting of silica aerogel or organic aerogel, xerogel, glass foam, foam-type adhesive, foamed synthetic resin and a low density synthetic resin.

2. A mobile telephone device provided with a filtier arrangement having a carrier substrate (1), a resonator unit, and a reflection element (2) between the carrier substrate (1) and the resonator unit, characterized in that the reflection element (2) consists of a unitary layer formed of an acoustically reflecting substance selected from the group consisting of silica aerogel or organic aerogel, xerogel, glass foam, foam-type adhesive, foamed synthetic resin and a low density synthetic resin.

3. A transmitter provided with a filter arrangement having a carrier substrate (1), a resonator unit, and a reflection element (2) between the carrier substrate (1) and the resonator unit, characterized in that the reflection element (2) consists of a uinitary layer formed of an acoustically reflecting substance selected from the group consisting of silica aerogel or organic aerbgel, xerogel, glass foam, foam-type adhesive, foamed synthetic resin and a low density synthetic resin.

4. A receiver provided with a filter arrangement having a carrier substrate (1), a resonator unit, and a reflection element (2) between the carrier substrate (1) and the resonator unit, characterized in that the reflection element (2) consists of a unitary layer formed of an acoustically reflecting substance selected from the group consisting of silica aerogel or organic aerogel, xerogel, glass foam, foam-type adhesive, foamed synthetic resin and a low density synthetic resin.

5. A wireless data transmission system provided with a filter arrangement having a carrier substrate (1), a resonator unit, and a reflection element (2) between the carrier substrate (1) and the resonator unit, characterized in that the reflection element (2) consists of a unitary layer formed of an acoustically reflecting substance selected from the group consisting of silica aerogel or organic aerogel, xerogel, glass foam, foam-type adhesive, foamed synthetic resin and a low density synthetic resin.

6. An electronic component with a carrier substrate (1), a resonator unit, and a reflection element (2) between the carrier substrate (1) and the resonator unit, characterized in that the reflection element (2) consists of a unitary layer formed of an acoustically reflecting substance selected from the group consisting of silica aerogel or organic aerogel, xerogel, glass foam, foam-type adhesive, foamed synthetic resin and a low density synthetic resin.

7. A filter arrangement as claimed in claim 1, characterized in that a further reflection element (6) is arranged on the resonator unit.

8. A filter arrangement as claimed in claim 1, characterized in that a protective layer (7) of an organic and/or inorganic material is provided over the filter arrangement.

9. A filter arrangement as claimed in claim 1, characterized in that the carrier substrate (1) comprises a ceramic material, a ceramic material with a glass planarizing layer, a glass-ceramic material, a glass material, silicon, GaAs, or sapphire.

10. A filter arrangement as claimed in claim 1, characterized in that the resonator unit comprises a piezoelectric layer (4) of PbZr$_{0.15}$Ti$_{0.85}$O$_3$ doped with 2% lanthanum.

11. A filter arrangement as claimed in claim 1, characterized in that a layer of SiO$_2$ is present above and below a reflection element (2, 6).

12. A filter arrangement as claimed in claim 1, characterized in that an adhesive layer is arranged between the carrier substrate (1) and the reflection element (2).

\* \* \* \* \*